United States Patent
Won et al.

(10) Patent No.: US 10,751,765 B2
(45) Date of Patent: Aug. 25, 2020

(54) REMOTE PLASMA SOURCE CLEANING NOZZLE FOR CLEANING A GAS DISTRIBUTION PLATE

(71) Applicant: Applied Materials, Inc., Santa Clara, CA (US)

(72) Inventors: Tae Kyung Won, San Jose, CA (US); Young Dong Lee, Hwaseong-Si (KR); Chien-Teh Kao, Sunnyvale, CA (US); Soo Young Choi, Fremont, CA (US); Sanjay D. Yadav, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 23 days.

(21) Appl. No.: 16/102,560

(22) Filed: Aug. 13, 2018

(65) Prior Publication Data
US 2020/0047222 A1   Feb. 13, 2020

(51) Int. Cl.
| C23C 16/452 | (2006.01) |
| C23C 16/44  | (2006.01) |
| C23C 16/455 | (2006.01) |
| H01J 37/32  | (2006.01) |
| B08B 7/00   | (2006.01) |

(52) U.S. Cl.
CPC ........ B08B 7/0035 (2013.01); C23C 16/4405 (2013.01); C23C 16/452 (2013.01); C23C 16/45563 (2013.01); H01J 37/3244 (2013.01); H01J 37/32357 (2013.01); *H01J 2237/335* (2013.01)

(58) Field of Classification Search
None
See application file for complete search history.

(56) References Cited

U.S. PATENT DOCUMENTS

| 6,192,898 B1 | 2/2001 | Aitani et al. |
| 6,230,652 B1 | 5/2001 | Tanaka et al. |
| 6,486,081 B1* | 11/2002 | Ishikawa ............... C23C 16/401 438/787 |
| 6,863,019 B2 | 3/2005 | Shamouilian et al. |
| 7,109,114 B2 | 9/2006 | Chen et al. |
| 8,795,793 B2 | 8/2014 | Choi et al. |
| 2003/0079757 A1* | 5/2003 | Shibata ............... C23C 16/4405 134/1.1 |
| 2005/0252451 A1* | 11/2005 | Beppu ................. C23C 16/4405 118/719 |
| 2006/0266288 A1 | 11/2006 | Choi |

(Continued)

*Primary Examiner* — Binu Thomas
(74) *Attorney, Agent, or Firm* — Patterson + Sheridan LLP

(57) ABSTRACT

The present disclosure relates to a chemical vapor deposition system for processing large area substrates. The chemical vapor deposition system includes a chemical vapor deposition chamber comprising a chamber body having a plurality of sidewalls, a lid assembly, and a bottom. A substrate support extends upward from the bottom within the chamber body. A gas distribution plate is located within the lid assembly. One or more cleaning gas injector ports coupled to corresponding one or more inlets in the plurality of sidewalls. Each of the one or more cleaning gas injector ports has a substantially oval-shaped or circular-shaped cleaning gas nozzle configured to provide reactive species from a remote plasma source to clean an underside of the gas distribution plate.

19 Claims, 3 Drawing Sheets

(56) References Cited

U.S. PATENT DOCUMENTS

| | | | |
|---|---|---|---|
| 2009/0156013 A1* | 6/2009 | Yousif | H01J 37/32357 |
| | | | 438/725 |
| 2009/0159104 A1 | 6/2009 | Huang et al. | |
| 2012/0108005 A1* | 5/2012 | Kawano | C23C 16/4405 |
| | | | 118/697 |
| 2015/0371831 A1* | 12/2015 | Rozenzon | C23C 16/45563 |
| | | | 239/548 |
| 2016/0032451 A1* | 2/2016 | Kurita | H01J 37/32357 |
| | | | 134/1.1 |

\* cited by examiner

REMOTE PLASMA SOURCE CLEANING NOZZLE FOR CLEANING A GAS DISTRIBUTION PLATE

BACKGROUND

Field

Embodiments of the present invention generally relate to a device and method for cleaning a chemical vapor deposition chamber. In particular, embodiments of the disclosure relate to a method and device for cleaning an underside of a perforated gas distribution plate of a gas distribution assembly in a plasma enhanced chemical vapor deposition chamber for processing large area substrates.

Description of the Related Art

Plasma enhanced chemical vapor deposition (PECVD) is generally employed to deposit thin films on substrates, such as semiconductor substrates, solar panel substrates, organic light emitting diode (OLED) substrates and liquid crystal display (LCD) substrates. These substrates can be fairly large and are substantially rectangular. PECVD is generally accomplished by introducing precursor gases into a vacuum chamber having the substrate disposed on a substrate support. The precursor gases are delivered to the substrate through a gas distribution assembly in the chamber.

During chemical vapor deposition, deposited material may be formed on components of the chamber, such as the gas distribution assembly and the internal sidewalls of the chamber. This deposited material can flake off during subsequent processing and create contaminating particles that can damage or destroy components of the substrate in the chamber. Thus, periodic chamber cleaning is required.

Currently, one method of chamber cleaning uses a remote plasma source. The remote plasma source dissociates a cleaning gas into radicals or reactive species outside of the chamber. The reactive species are then flowed into the chamber to clean the chamber. By generating the reactive species remotely, the inside of the chamber is not exposed to the potentially damaging high levels of power needed to dissociate the cleaning gas.

It has been observed that chamber cleaning using a remote plasma source is often not as efficient as would be expected based on the estimated dissociation rate provided by the remote plasma source. Reactive species generated by remote plasma sources can recombine to form molecules that are less efficient in cleaning than the radicals. For example, the cleaning gas $NF_3$ may generate fluorine radicals that recombine to form $F_2$.

One cause of recombination is the restricted flow area provided by the gas distribution assembly of chemical vapor deposition chambers. The gas distribution assemblies typically contain a number of very small diameter holes through which the reactive species from the remote plasma source must pass in order to enter the processing region of the chamber. In such a small area, the reactive species are more likely to collide and recombine than in a larger area.

Low chamber cleaning efficiency resulting from recombination increases the amount of time required to clean a chamber, which reduces the substrate throughput of the chamber and increases the cost of the cleaning gas required to clean the chamber. The extra cleaning time required to sufficiently clean parts of the chamber can result in damage by over-etching to other parts of the chamber. Thus, there remains a need for a method and apparatus to more efficiently clean chemical vapor deposition chambers using a remote plasma source.

SUMMARY

The present disclosure generally relates to a chemical vapor deposition system for processing large area substrates. Large area substrates generally include glass and plastic rectangular substrates suitable for fabricating display panels, solar panels, and the like. The chemical vapor deposition system includes a chemical vapor deposition chamber comprising a chamber body having a plurality of sidewalls, a lid assembly, and a bottom. A substrate support extends upward from the bottom within the chamber body. A gas distribution plate is located within the lid assembly. One or more cleaning gas injector ports coupled to corresponding one or more inlets in the plurality of sidewalls. Each of the one or more cleaning gas injector ports has a substantially oval-shaped or circular-shaped cleaning gas nozzle configured to provide reactive species from a remote plasma source to clean an underside of the gas distribution plate.

The present disclosure further relates to a cleaning gas injector port having a substantially rectangular shaped body. The rectangular shaped body encapsulates a substantially oval-shaped cleaning gas nozzle configured to provide reactive species from a remote plasma source to clean an underside of a gas distribution plate of a chemical vapor deposition chamber.

The present disclosure further relates to a method of cleaning a chemical vapor deposition chamber. The method includes introducing reactive species from a remote plasma source into the chemical vapor deposition chamber to provide reactive species from the remote plasma source into one or more cleaning gas injector ports coupled to corresponding one or more inlets in a plurality of sidewalls of the chamber. The method further includes flowing the reactive species through a substantially oval-shaped or circular-shaped cleaning gas nozzle of the one or more cleaning gas injector ports to direct the reactive species toward an underside of a gas distribution plate located within the chemical vapor deposition chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide a chemical vapor deposition system that includes a chemical vapor deposition chamber comprising a remote plasma source that delivers cleaning gases through the sidewalls of the chamber using one or more cleaning gas injector ports directed toward an underside of a gas distribution plate in a gas distribution assembly without flowing the reactive species through the gas distribution assembly, i.e., while bypassing the gas distribution assembly.

Figure 1:
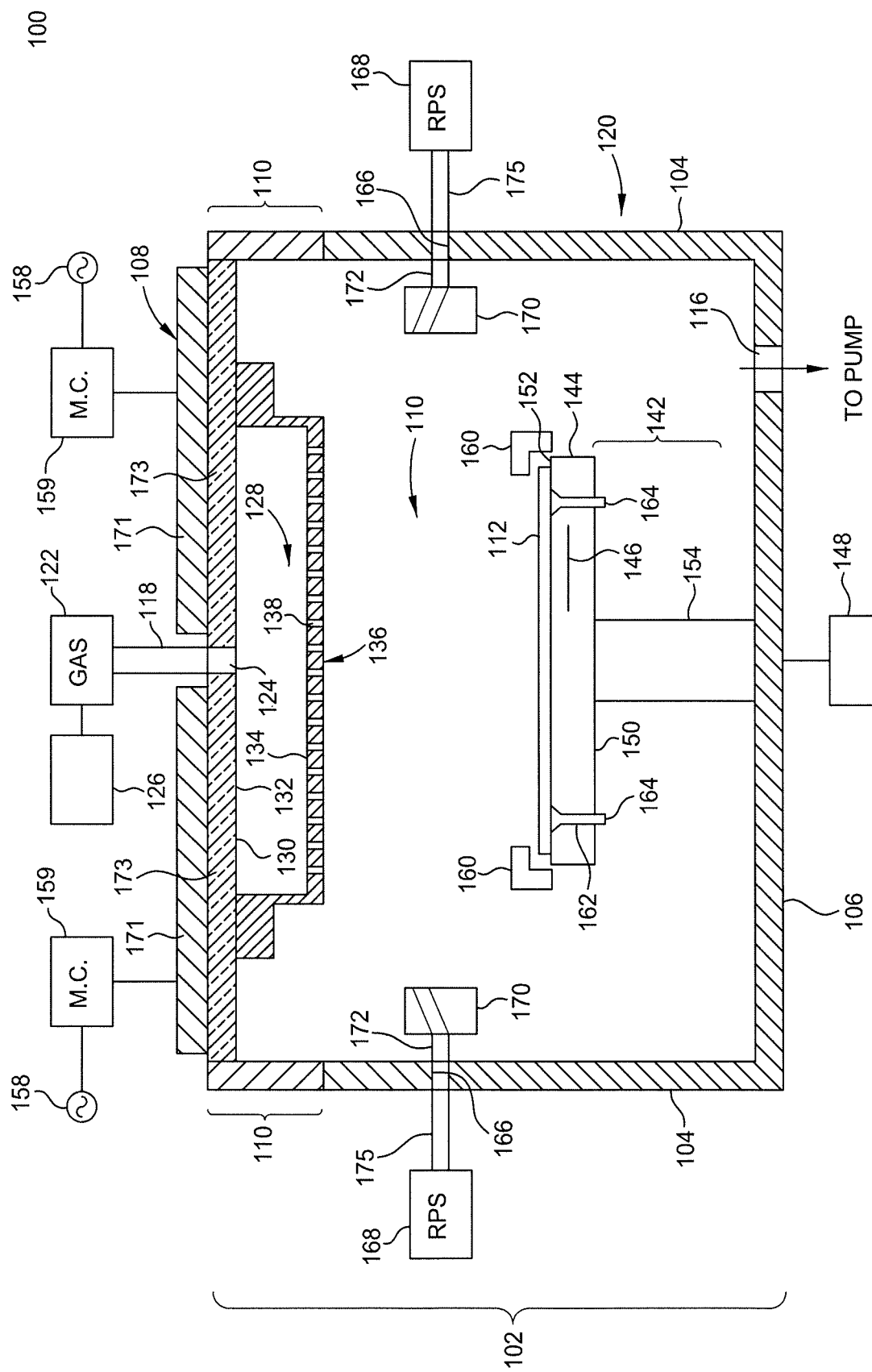
FIG. 1 is a schematic cross-sectional view of a plasma enhanced chemical vapor deposition system according to an embodiment.

FIG. 1 is a schematic cross-sectional view of a plasma enhanced chemical vapor deposition (PECVD) system 100 according to an embodiment. The system 100 generally includes a chemical vapor deposition chamber 102 coupled to a precursor supply 122. The chemical vapor deposition chamber 102 has sidewalls 104, a bottom 106, and a lid assembly 108 that define a processing volume or region 110 inside the chamber 102 and form a chamber body 120. The sidewalls 104 are oriented at substantially right angles to form a substantially rectangular processing region 110 that matches the profile of substantially rectangular substrates 112 that are processed within the chamber 102.

The processing region 110 is typically accessed through a port (not shown) in the sidewalls 104 that facilitates movement of a substrate 112 into and out of the chemical vapor deposition chamber 102. The sidewalls 104 and bottom 106 are typically fabricated from aluminum, stainless steel, or other materials compatible with processing. The sidewalls 104, bottom 106, and lid assembly 108 define the chamber body 120.

A gas inlet conduit or pipe 118 extends into an entry port or first inlet 124 in a central lid region of the chamber body 120 and is connected to sources of various precursor gases. A precursor supply 122 contains the precursors that are used during deposition. The precursors may be gases or liquids. The particular precursors that are used depend upon the materials that are to be deposited onto the substrate 112. The process gases flow through the inlet pipe 118 into the first inlet 124 and then into the chamber 102. An electronically operated valve and flow control mechanism 126 controls the flow of gases from the gas supply into the first inlet 124. Spent precursor gasses are evacuated from the chamber body 120 through an output port 116 that is connected to a vacuum pump (not shown).

The lid assembly 108 provides an upper boundary to the processing region 110. The lid assembly 108 includes a central lid region 132 in which the first inlet 124 is defined. The lid assembly 108 typically can be removed or opened to service the chemical vapor deposition chamber 102. In one embodiment, the lid assembly 108 is fabricated from aluminum (Al). In another embodiment, the lid assembly 108 may include a metal antenna 171 on either side of the output port 116 coupled to a corresponding matching circuit 159 (see below) and overlying a corresponding dielectric window 173. A gas distribution assembly 128 is coupled to an interior underside 130 of the lid assembly 108 in the central lid region 132. The gas distribution assembly 128 includes a perforated showerhead 134 in a gas distribution plate 136 through which gases, including reactive species generated by the remote plasma source and processing gases for chemical vapor deposition, are delivered to the processing region 110. The perforated area 138 of the gas distribution plate 136 is configured to provide uniform distribution of process gases passing through the gas distribution assembly 128 into the process volume 110. In one embodiment, the gas distribution plate 136 is fabricated from stainless steel, aluminum (Al), anodized aluminum, nickel (Ni) or another RF conductive material. In another embodiment, the gas distribution plate 136 is fabricated from a dielectric material. The gas distribution plate 136 is configured with a thickness that maintains sufficient flatness and uniformity so as to not adversely affect substrate processing. In one embodiment, the gas distribution plate 136 has a thickness of between about 1.0 inch to about 2.0 inches and is substantially rectangular to match the generally rectangular substrate 112.

A support assembly 142 supports a generally rectangular substrate 112 during processing. In one embodiment, the substrate support assembly 142 comprises a substrate support 144 having an aluminum body that encapsulates at least one embedded heater 146. The heater 146, such as a resistive element, disposed in the support assembly 142, is coupled to an optional power source 148 and controllably heats the support assembly 142 and the substrate 112 positioned thereon to a predetermined temperature.

Generally, the support assembly 142 has the substrate support 144 comprising a lower side 150 and an upper side 152. The upper side 152 supports the substrate 112. The lower side 150 has a stem 154 coupled thereto. The stem 154 couples the support assembly 142 to a lift system (not shown) that moves the support assembly 142 between an elevated processing position (as shown) and a lowered position that facilitates substrate transfer to and from the chemical vapor deposition chamber 102. The stem 154 additionally provides a conduit for electrical and thermocouple leads between the support assembly 142 and other components of the system 100.

The support assembly 142 generally is grounded such that RF power supplied by a pair of power sources 158 and matching circuits 159 to the gas distribution assembly 128 positioned between the metal antennas 171 and the corresponding dielectric windows 173 of the lid assembly 108 and substrate support assembly 142 (or other electrode positioned within or near the lid assembly of the chamber) may excite gases present in the processing region 110 between the support assembly 142 and the gas distribution assembly 128. The support assembly 142 additionally supports a circumscribing shadow frame 160. Generally, the shadow frame 160 prevents deposition at the edge of the substrate 112 and support assembly 142 so that the substrate does not adhere to the support assembly 142. The support assembly 142 has a plurality of holes 162 disposed therethrough that accept a plurality of lift pins 164.

In addition to first inlet 124, the chamber body 120 includes a plurality of second inlets 166 that provide reactive species from a remote plasma source 168 though intervening cleaning gas injector ports 170, according to an embodiment, as shown and described below with respect to FIG. 3. Second inlets 166 are configured to provide reactive species from the remote plasma sources 168 using corresponding cleaning gas injector ports 170 coupled to the second inlets 166 internal to the chemical vapor deposition chamber 102, to clean the underside of the perforated gas distribution plate 136 of the gas distribution assembly 128 within the processing region 110 of the chamber 102 while bypassing the gas distribution assembly 128. In other words, the reactive species provided by the second inlets 166 do not pass through the perforated gas distribution plate 136 from the first inlet 124 above the gas distribution assembly 128. The second inlets 166 and the cleaning gas injector port 170 may be located on an inner side of the sidewall 104 within the processing volume 110 of the chamber body 120 below the gas distribution assembly 128, such as between the gas distribution plate 136 and the substrate support 144. In another embodiment, the cleaning gas injector ports 170 are mounted on an outer side of the sidewall 104 external to the processing volume 110 of the chamber body 120 having an inlet hole 172 formed therein. A gas line 175 from the remote plasma sources 168 to the second inlets 166 deliver reactive species from the remote plasma source 168 to the gas injector port 170 through the second inlets 166.

As the plasma enhanced chemical vapor deposition systems provided according to embodiments of the invention include second inlets 166 that introduce reactive species into a processing region 110 of a chemical vapor deposition chamber 102 while bypassing the gas distribution assembly 128 of the chemical vapor deposition chamber 102, embodiments of the invention provide a method of cleaning the gas distribution plate 136 of the plasma enhanced chemical vapor deposition system 100.

The method includes introducing reactive species from a remote plasma source 168 into the processing region 110 of the chemical vapor deposition chamber 100 using the cleaning gas injector ports 170 while bypassing the gas distribution assembly 128 of the chemical vapor deposition chamber 102.

Figure 2:
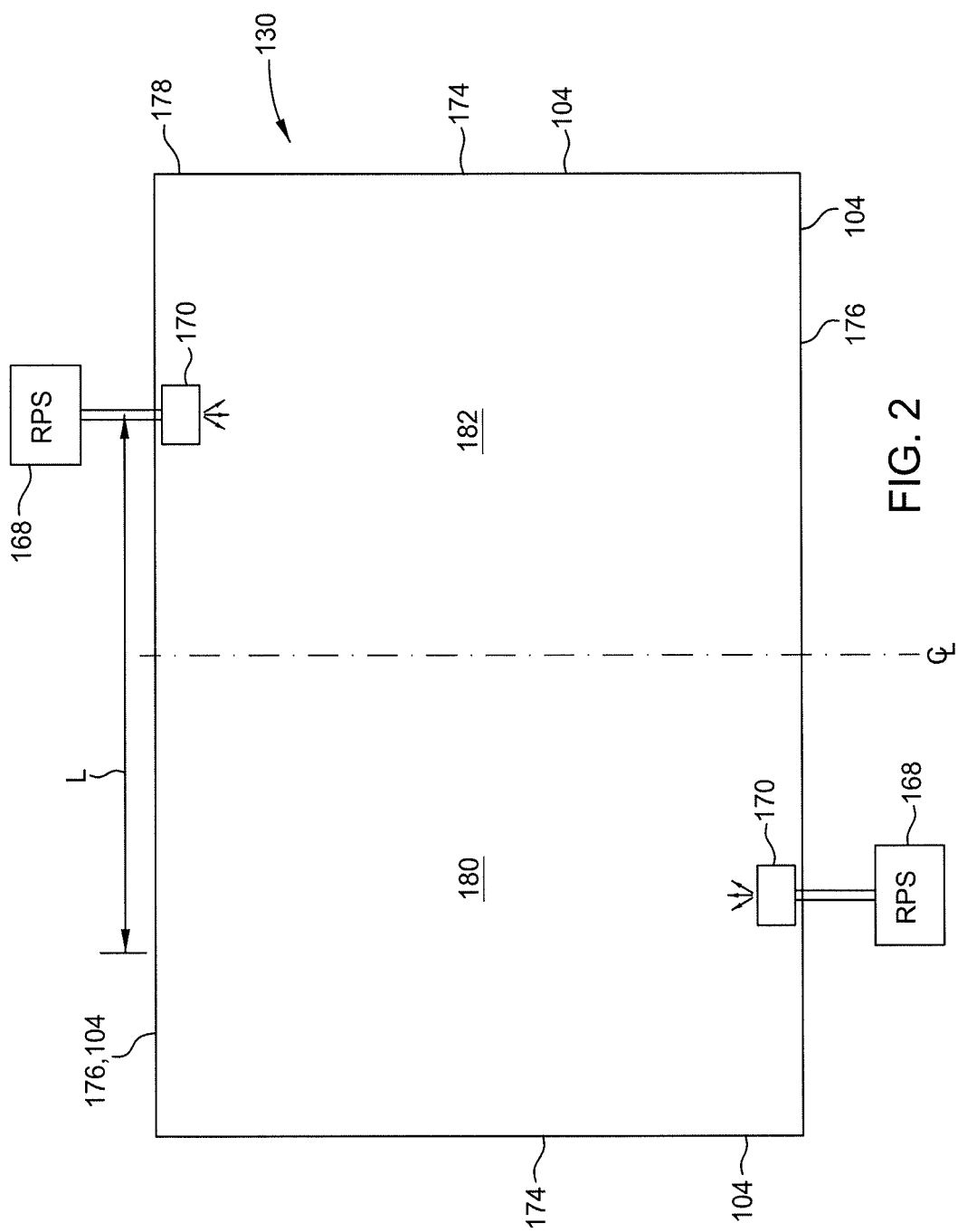
FIG. 2 is a view of the chemical vapor deposition chamber from an interior underside of the lid assembly in the central lid region of the chemical vapor deposition chamber according to an embodiment.

FIG. 2 is a view of the chemical vapor deposition chamber 102 from an interior underside 130 of the lid assembly 108 in the central lid region 132 of the chemical vapor deposition chamber 102 according to an embodiment of the invention. FIG. 2 shows short sides 174 and the long sides 176 of the substantially rectangular sidewalls 104 of the chemical vapor deposition chamber 102. FIG. 2 further shows an underside 178 of the perforated gas distribution plate 136 divided into two coverage areas 180 and 182. A cleaning gas injector port 170 is located on each of the long sides 176 of the sidewalls 104 offset from each other by an amount L. L can be varied such that the cleaning gas injector ports 170 are configured to introduce cleaning gases from remote plasma sources 168 to clean a specified coverage area 180, 182 of the underside 178 of the perforated gas distribution plate 136 through the second inlets 166 in the sidewall 104 of the chemical vapor deposition chamber 102 between the gas distribution assembly 128 and the support assembly 142. The coverage areas 180, 182 may be varied by varying the positions of the cleaning gas injector ports 170 relative to each other (to change the distance L) along the long sides 176 of the sidewalls 104 from a widest position (largest length of L) to substantially facing each other (L=0) such that the two or more cleaning gas injector ports 170 are aligned along a common axis intersecting perpendicularly to the long sides 176 or the short sides 174 of the sidewalls 104.

In another embodiment, more than two cleaning gas injector ports 170 may be spaced along the long sides 176 of the sidewalls 104. In another embodiment, one or both or more of the cleaning gas injector ports 170 may be placed along the short sides 174 of the sidewalls 104. Nozzles (not shown in FIG. 2) in the cleaning gas injector ports 170 are angled in an upward direction to clean the underside 178 of the perforated gas distribution plate 136.

Figure 3:
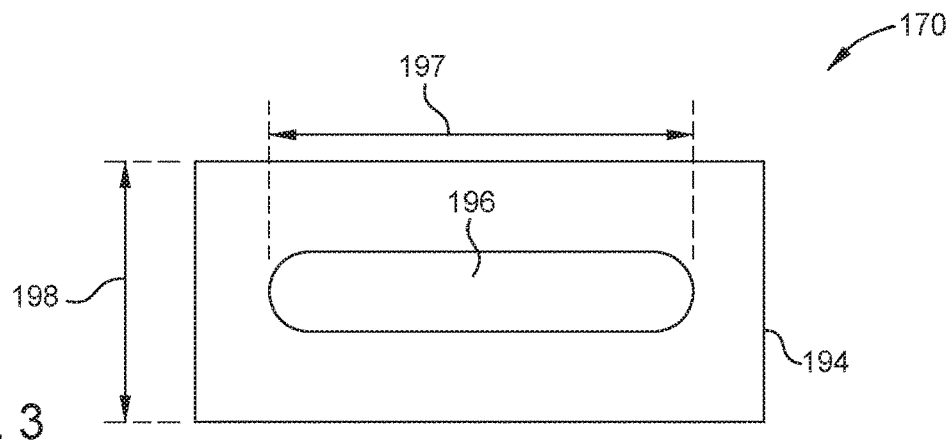
FIG. 3 is a front view of a cleaning gas injector port according to an embodiment.

FIG. 3 is a front view of a cleaning gas injector port 170 according to an embodiment. The front profile 194 of the cleaning gas injector port 170 is substantially rectangular. The front profile 194 of the cleaning gas injector port 170 is oriented in a long dimension along a horizontal long axis 197 and a vertical short axis 198 relative to the chamber sidewalls 104. The front profile 194 is sized and shaped to maximize the coverage areas 180, 182 for cleaning the perforated gas distribution plate 136. In one embodiment, the front profile 194 includes a substantially oval-shaped output port 196 oriented horizontally along the long axis 197. In one embodiment, the oval-shaped output port 196 has dimensions of 160 mm along the long axis 197 and 40 mm along the short axis 198. In another embodiment, the front profile 194 may include a substantially circular shaped output port 196.

Figure 4A:
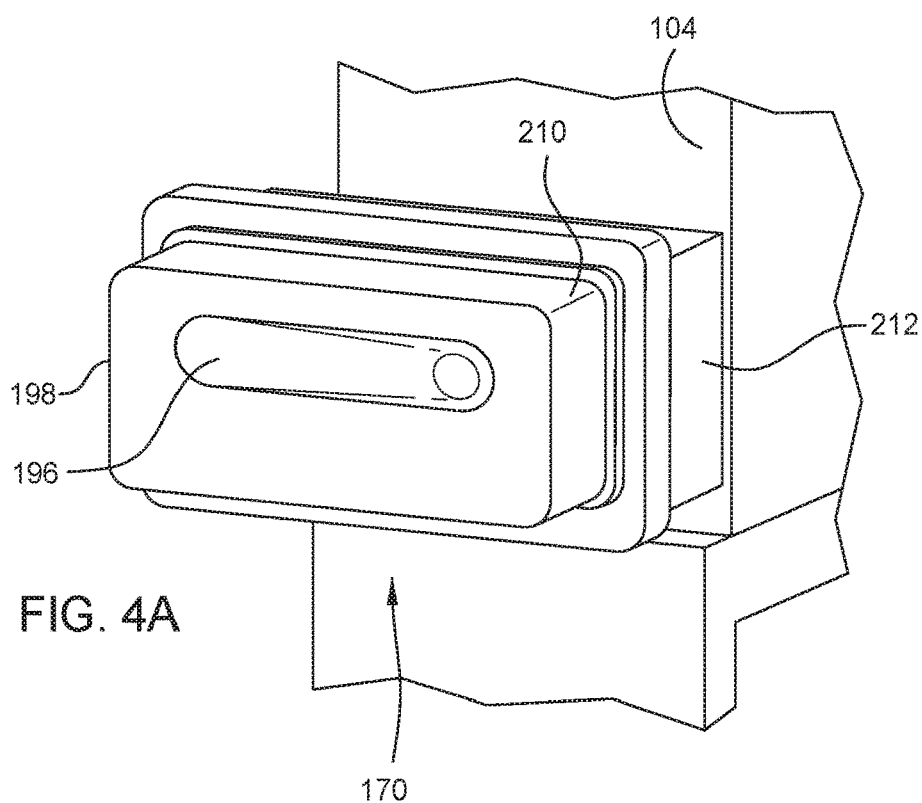
FIGS. 4A and 4B are a perspective view and a side view, respectively, of the cleaning gas injector port installed along a sidewall within the chemical vapor deposition chamber.
Figure 4B:
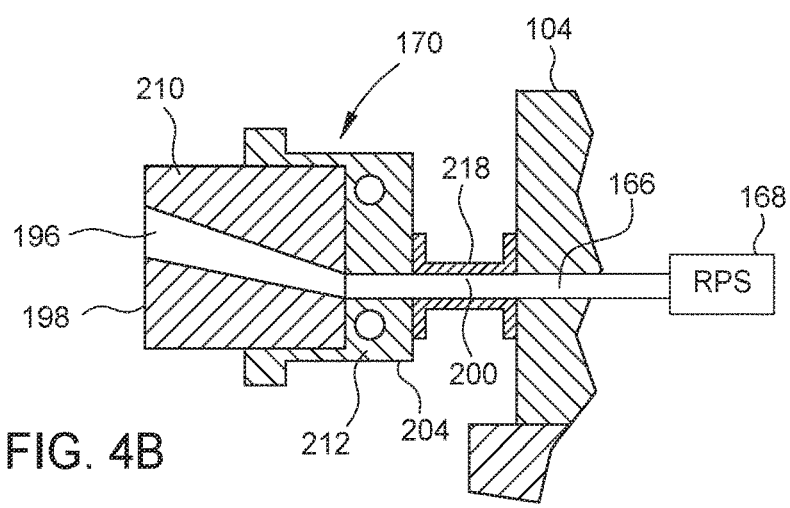

FIGS. 4A and 4B are perspective view and a side view, respectively, of the cleaning gas injector port 170 installed along a sidewall 104 within the chemical vapor deposition chamber 102. The cleaning gas injector port 170 comprises two sections: a cleaning gas nozzle 210 and a housing 212 that permits mounting of the cleaning gas nozzle 210 internal to the sidewall 104 of the chamber 102. The housing 212 engages the cleaning gas nozzle 210 along a portion of three sides facing the sidewall 104. The housing 212 further includes a circular mounting tube 218 that connects the housing 212 to the second inlets 166 on the sidewall 104. The tube 218 and has a substantially circular shape. In one embodiment, the housing 212 has dimensions of 137 mm by 274 mm.

The cleaning gas nozzle 210 has a substantially external rectangular shape with an inlet 200 at a back end 204 and the oval-shaped output port 196 at a front end 198 through which a cleaning gas nozzle passes from the housing 212. From the inlet 200 to the oval-shaped output port 196, the cleaning gas nozzle 210 takes an upward angular turn and transitions from a circular shape to an oval shape corresponding to the oval-shaped output port 196. This upward angled turn of the cleaning gas nozzle 210 is oriented to permit efficient cleaning of the underside 178 of the perforated gas distribution plate 136. The angle of the cleaning gas nozzle 210 is a non-zero acute angle of about 15 degrees from the horizontal long axis 197.

In another embodiment, the cleaning gas injector port 170 may be embedded entirely in the sidewall 104 of the chamber 102. In another embodiment, the cleaning gas injector port 170 is located external to a sidewall 104 and distributes the reactive species through an oval-shaped hole in the sidewall 104.

The reactive species input to the cleaning gas injector port 170 may be formed from conventional cleaning gases, such as halogen-containing gases, e.g., fluorine-containing gases, such as $NF_3$, $F_2$, $CF_4$, $SF_6$, $C_2F_6$, $CCl_4$, $C_2Cl_6$, or combinations thereof, using standard remote plasma source conditions. In situ power provided by the chemical vapor deposition chamber 102, such as internal RF power, may also be used during the chamber cleaning process to enhance the cleaning rate by additionally decomposing species, such as $F_2$ species.

By providing the reactive species via the cleaning gas injector port 170, an underside 178 of the perforated gas distribution plate 136 is cleaned or at least partially cleaned by the reactive species. Preferably, a majority of the reactive species that are introduced into the processing region 110 of the chamber 102 are introduced while bypassing the gas distribution assembly 128. For example, reactive species may be introduced into the processing region 110 of the chamber 102 through the first inlet 124 and gas distribution assembly 128 at a first flow rate, and reactive species may be introduced into the processing region of the chamber through the second inlet 166 via the cleaning gas injector port 170 that bypasses the gas distribution assembly at a second flow rate that is between about 1 and about 10 times greater than the first flow rate. For example, the first flow rate may be about 2 slm, and the second flow rate may be about 10 slm for a modified AKT 25 K PECVD chamber.

It is believed that providing a majority of the reactive species to the chamber 102 while bypassing the gas distribution assembly 128 increases chamber cleaning efficiency by reducing the amount of recombination of the active species caused flowing the reactive species through the small diameter (e.g., 16 mils) perforations of the gas distribution assembly 128.

While the foregoing is directed to examples of the present disclosure, other and further examples of the disclosure may be devised without departing from the basic scope thereof, and the scope thereof is determined by the claims that follow.

What is claimed is:

1. A plasma enhanced chemical vapor deposition (PECVD) system for processing flat panel display substrates, comprising:
   a chemical vapor deposition chamber comprising:
     a chamber body having a plurality of sidewalls, a lid assembly, and a bottom;
     a substrate support extending upward from the bottom within the chamber body;
     a gas distribution plate located within the lid assembly; and
     one or more cleaning gas injector ports coupled to corresponding one or more inlets in the plurality of sidewalls,
     wherein each of the one or more cleaning gas injector ports has a substantially oval-shaped or circular-shaped cleaning gas nozzle configured to provide reactive species from a remote plasma source to clean an underside of the gas distribution plate, and wherein each of the one or more cleaning gas injector ports further comprises a housing that engages the cleaning gas nozzle along a portion of three sides of the nozzle facing a first sidewall of the plurality of sidewalls.

2. The PECVD system of claim 1, wherein the cleaning gas nozzle is oriented upward at an acute angle from a horizontal axis that intersects the first sidewall of the plurality of sidewalls at a right angle.

3. The PECVD system of claim 2, wherein the acute angle is about 15 degrees.

4. The PECVD system of claim 1, wherein the one or more cleaning gas injector ports is two or more cleaning gas injector ports distributed about the plurality of sidewalls to clean different portions of the gas distribution plate.

5. The PECVD system of claim 4, wherein the two or more cleaning gas injector ports are offset from each other along the plurality of sidewalls.

6. The PECVD system of claim 4, wherein the two or more cleaning gas injector ports are aligned along a common axis with each other along the plurality of sidewalls.

7. The PECVD system of claim 1, wherein each of the one or more cleaning gas injector ports is located external to the first sidewall of the plurality of sidewalls and distributes the reactive species through an oval-shaped or circular-shaped hole in the first sidewall.

8. The PECVD system of claim 1, wherein each of the one or more cleaning gas injector ports is embedded in the first sidewall of the plurality of sidewalls.

9. The PECVD system of claim 1, wherein each of the one or more cleaning gas injector ports is mounted internal to the first sidewall of the plurality of sidewalls and distributes the reactive species through a housing having a circular tube mounted to the first sidewall.

10. The PECVD system of claim 9, wherein each of the one or more cleaning gas injector ports is mounted below the gas distribution plate and above the substrate support.

11. The PECVD system of claim 1, wherein the housing has an oval-shaped or a circular-shaped inlet and an oval shaped or circular-shaped outlet that matches the shape of the nozzle.

12. The PECVD system of claim 1, wherein the reactive species input to a cleaning gas injector port of the one or more cleaning gas injector ports is formed from halogen-containing gases.

13. The PECVD system of claim 12, wherein the halogen-containing gases are fluorine-containing gases taken from the group consisting of $NF_3$, $F_2$, $CF_4$, $SF_6$, $C_2F_6$, $CCl_4$, and $C_2Cl_6$, or combinations thereof.

14. A plasma enhanced chemical vapor deposition (PECVD) system for processing flat panel display substrates, comprising:
   a chemical vapor deposition chamber comprising:
     a chamber body having a plurality of sidewalls, a lid assembly, and a bottom;
     a substrate support extending upward from the bottom within the chamber body;
     a gas distribution plate located within the lid assembly; and
     one or more cleaning gas injector ports coupled to corresponding one or more inlets in the plurality of sidewalls, wherein:
       each of the one or more cleaning gas injector ports has a substantially oval-shaped shaped cleaning gas nozzle configured to provide reactive species from a remote plasma source to clean an underside of the gas distribution plate,
       each of the one or more cleaning gas injector ports further comprises a housing that engages the cleaning gas nozzle along a portion of three sides of the nozzle facing a first sidewall of the plurality of sidewalls, and
       the housing has an oval-shaped or circular-shaped inlet and an oval shaped outlet that matches the shape of the nozzle.

15. The PECVD system of claim 14, wherein the cleaning gas nozzle is oriented upward at an acute angle from a horizontal axis that intersects the first sidewall of the plurality of sidewalls at a right angle.

16. The PECVD system of claim 15, wherein the acute angle is about 15 degrees.

17. A plasma enhanced chemical vapor deposition (PECVD) system for processing flat panel display substrates, comprising:
   a chemical vapor deposition chamber comprising:
     a chamber body having a plurality of sidewalls, a lid assembly, and a bottom;
     a substrate support extending upward from the bottom within the chamber body;
     a gas distribution plate located within the lid assembly; and
     one or more cleaning gas injector ports coupled to corresponding one or more inlets in the plurality of sidewalls, wherein:
       each of the one or more cleaning gas injector ports has a cleaning gas nozzle configured to provide reactive species from a remote plasma source to clean an underside of the gas distribution plate, each of the one or more cleaning gas injector ports further comprises a housing that engages the cleaning gas nozzle along a portion of three sides of the nozzle facing a first sidewall of the plurality of sidewalls, and the housing has an oval-shaped or circular-shaped inlet and an oval shaped or circular-shaped outlet that matches the shape of the nozzle.

18. The PECVD system of claim 17, wherein the cleaning gas nozzle is oriented upward at an acute angle from a horizontal axis that intersects the first sidewall of the plurality of sidewalls at a right angle.

19. The PECVD system of claim 18, wherein the acute angle is about 15 degrees.

\* \* \* \* \*